United States Patent [19]

Wu

[11] Patent Number: 5,998,247

[45] Date of Patent: Dec. 7, 1999

[54] PROCESS TO FABRICATE THE NON-SILICIDE REGION FOR ELECTROSTATIC DISCHARGE PROTECTION CIRCUIT

[75] Inventor: Shye-Lin Wu, Hsinchu, Taiwan

[73] Assignee: Texas Instruments - Acer Incorporated, Hsinchu, Taiwan

[21] Appl. No.: 09/057,866

[22] Filed: Apr. 9, 1998

[51] Int. Cl.$^6$ ............................................. H01L 21/8238
[52] U.S. Cl. ............................................. 438/200; 438/664
[58] Field of Search ................................. 438/200, 230, 438/231, 232, 275, 655, 664

[56] References Cited

U.S. PATENT DOCUMENTS

| | | | |
|---|---|---|---|
| 4,717,684 | 1/1988 | Katto et al. | 438/200 |
| 5,529,941 | 6/1996 | Huang | 438/200 |
| 5,532,178 | 7/1996 | Liaw et al. | 438/200 |
| 5,589,423 | 12/1996 | White et al. | 438/664 |
| 5,672,527 | 9/1997 | Lee | 438/275 |

*Primary Examiner*—Chandra Chaudhari
*Attorney, Agent, or Firm*—Harness, Dickey & Pierce, P.L.C.

[57] ABSTRACT

The present invention discloses a method to fabricate the non-silicide region for an ESD protective devices in a substrate. Firstly, a substrate is provided and it has field oxide regions to define an electrostatic discharge (ESD) region, a PMOS region and an NMOS region. A gate and a gate oxide for the NMOS region and the PMOS region are define. An N-type and a P-type ion implantation are respectively performed to form a lightly doped drain (LDD) for said NMOS region and said PMOS region. A P-type and an N-type implantation is implemented to form source/drain regions for the NMOS device and the PMOS device, respectively. Afterwards, a silicon oxide layer is defined to form spacers for the polysilicon layer and the gates for the NMOS region and the PMOS region. A self-aligned silicide process is performed to form a silicide layer on the gate and the source/drain regions for the PMOS device and the NMOS device. The polysilicon layer is etched back to form a gate for a ESD protective device and an implantation process is performed to form source/drain regions of the ESD protective device.

20 Claims, 6 Drawing Sheets

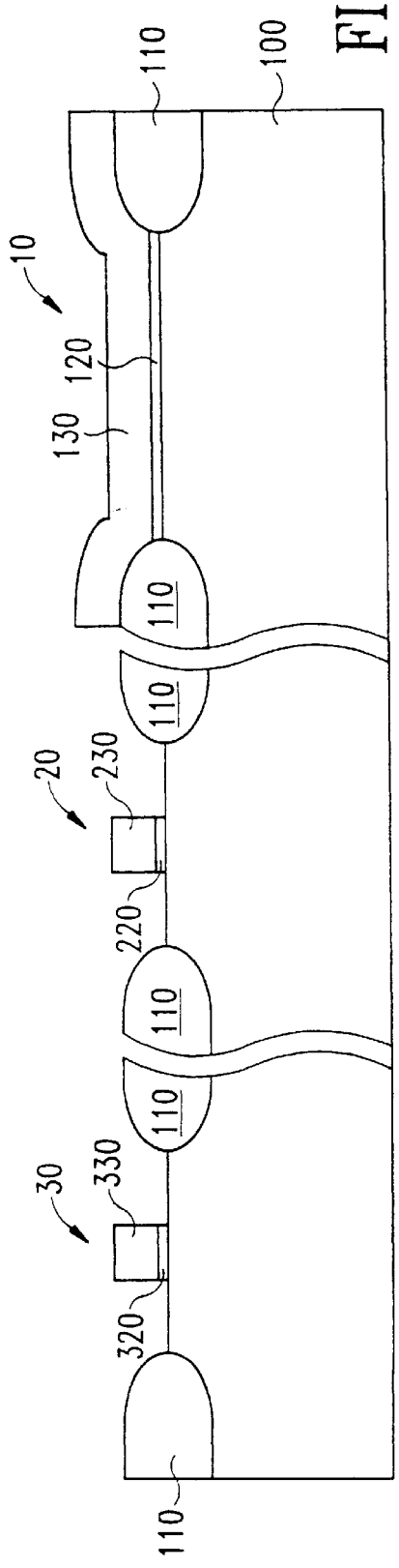
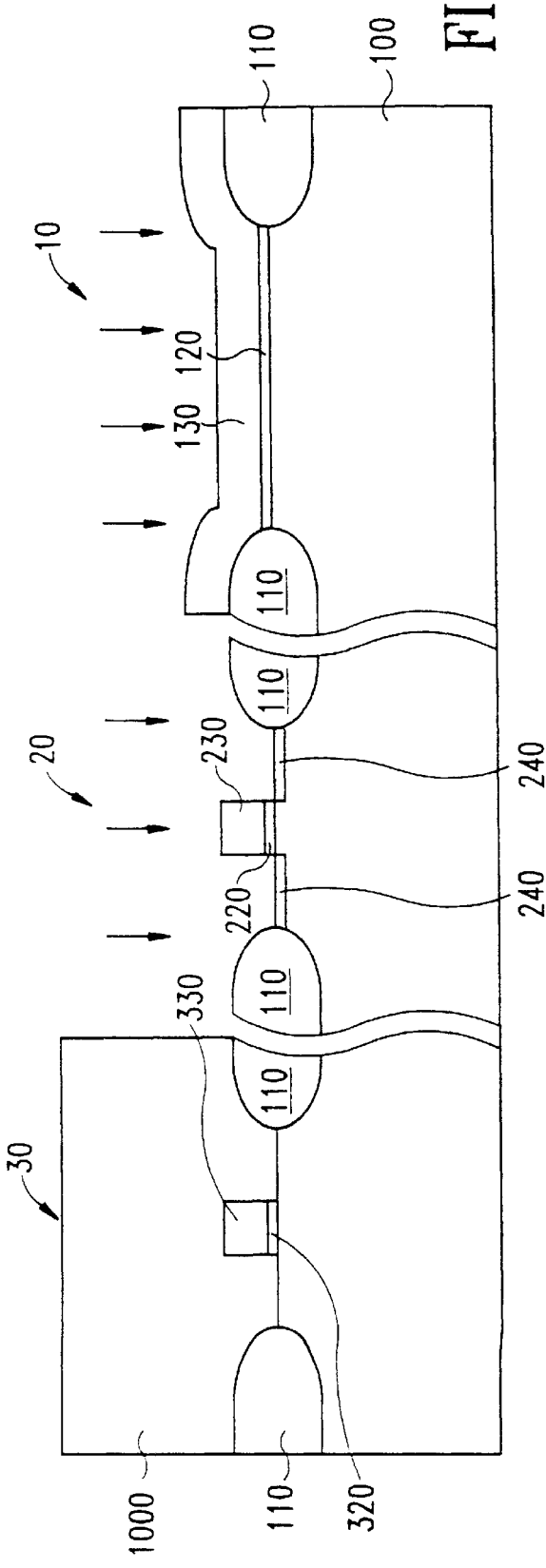

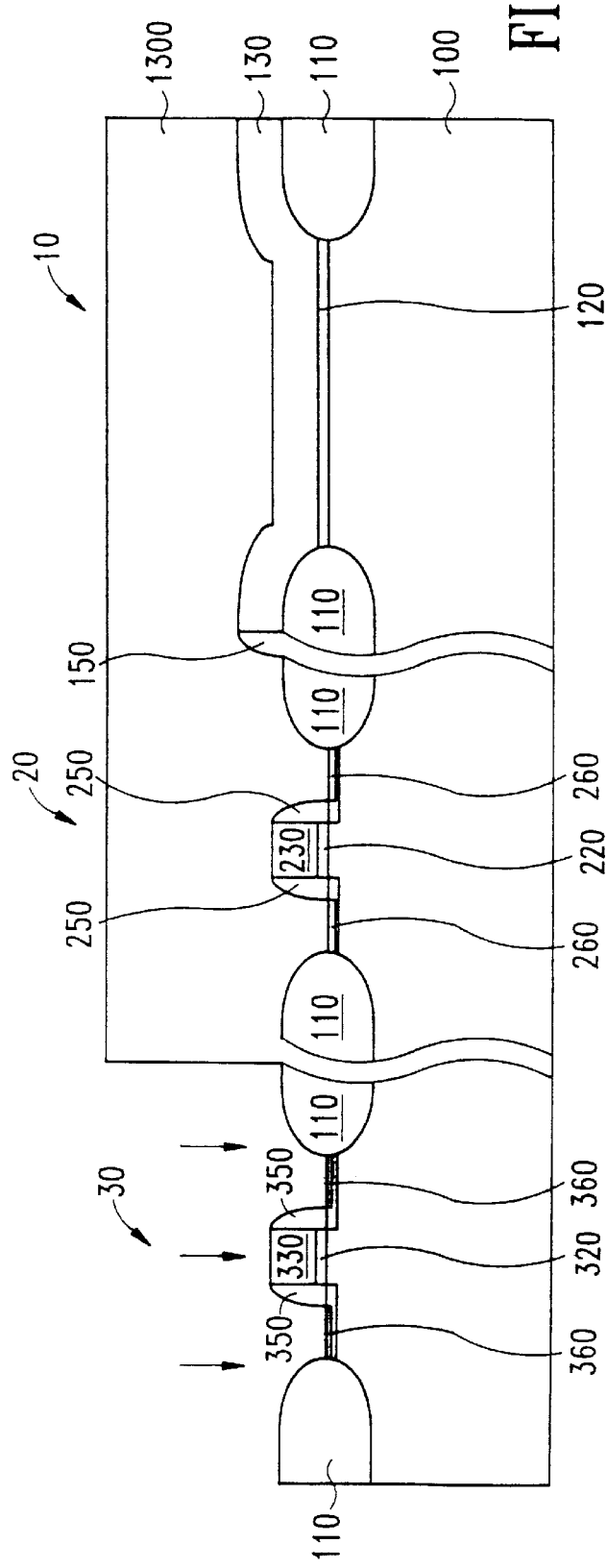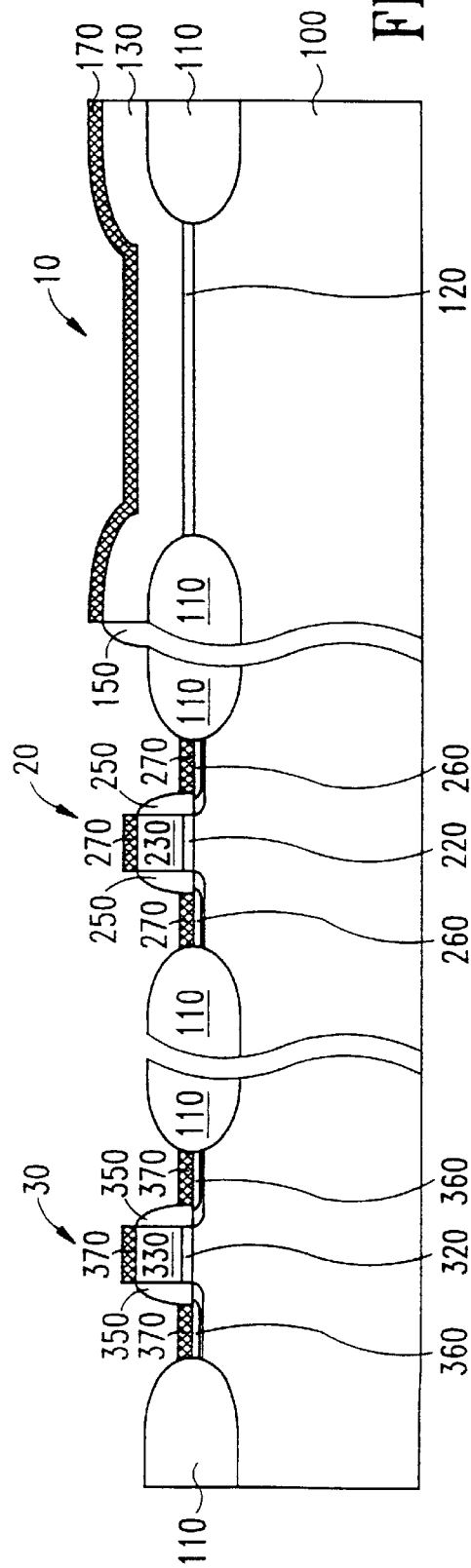

PROCESS TO FABRICATE THE NON-SILICIDE REGION FOR ELECTROSTATIC DISCHARGE PROTECTION CIRCUIT

FIELD OF THE INVENTION

The present invention relates to a method of manufacturing electrostatic discharge (ESD) protective devices, and more specifically, to a method of manufacturing the non-silicided ESD protective device on a substrate.

BACKGROUND OF THE INVENTION

Logic ultra-large-scaled-integrated (ULSI) circuits with embedded DRAM are demanded as high performance devices in order to reduce power consumption and to increase packing density. Self-aligned silicide (salicide) process is one of the most promising technology for deep-submicron logic ULSIs. This is due to the fact that the slicided devices have a lower contact resistance than the non-salicided devices, as reference to IEDM Tech. Dig. p.451, 1996, entitled "A Thermally Stable Ti-W Salicide for Deep-Submicron Logic with Embedded DRAM".

Thus, the salicided device have a faster operation speed than the non-salicided devices. However, the devices with a self-aligned silicided contact shows a worse electrostatic shielding discharge (ESD) performance than the non-salicided devices. As is described as below descriptions in detail, using salicide process have great influence with the performance of devices.

The relation between self-aligned silicide process and the ESD capability have been reported in the article of Amerasekera et al, entitled "Correlating Drain Junction Scaling, Salicide Thickness, and Lateral NPN behavior, with the ESD/EOS performance of a 0.25 $\mu$m CMOS Process", published in IEDM Tech. Dig., p. 893 on 1996. It is noted that the current gain of a self-biased lateral NPN transistor is related to the salicide thickness in a 0.25 $\mu$m CMOS process, the relationship between the current gain and the ESD performance was examined in this article. The current gain was strongly influenced by the effective drain/source diffusion depth below the salicide, which was determined by the implant energy and the amount of the active diffusion consumed in silicidation. The devices, with lower current gain, having lower ESD capability are made sure by the authors. The current gain was affected by the NMOS drain junction property so that the ESD performance could be enhanced by either increasing the drain/source implant energy or reducing the salicide thickness. Neither the increase of the implant energy nor the decrease of salicide thickness will significantly change the NMOS characteristic.

A method to fabricate an electrostatic discharge protection circuit is disclosed in U.S. Pat. No. 5,672,527 which was filed on Mar. 8, 1996. The inventors of the patent proposed a method with a photomask instead of several masks as in a conventional process during the salicide process of ESD circuits. However, a complicating etching process was used for accomplishing the salicide process, the devices could be degraded from the etching process. Many stages are used to simultaneously fabricate ESD devices and MOS devices on a substrate in the patent so that the devices have a long processing time and a difficult processing flow.

Another process for fabricating a non-silicided region in an integrated circuit is disclosed in U.S. Pat. No. 5,589,423 of Whit et al for "PROCESS FOR FABRICATING A NON-SILICIDED REGION IN AN INTEGRATED CIRCUIT". The inventive process provided a substrate having a silicide blocking layer overlaying a portion of the substrate surface. After that a silicide layer is formed on a substrate, a mask is formed to overlie a first portion of the silicide blocking layer. A selectively etching process is used to remove the silicide blocking layer on a second portion of that. The first portion of the silicide layer is protected from attacking by chemical etchants using the mask as a protective layer during the etching process. Following the etching process, the mask is stripped and a non-silicided region in an integrated circuit is formed on a substrate.

A non-silicided ESD protective device could be fabricated on a substrate according to the method of U.S. Pat. No. 5,589,423. In the patent, peripheral circuits and ESD protective circuits are simultaneously defined on a semiconductor substrate and a silicide layer is formed on entire regions. Afterwards, a selectively etching process is used to remove the silicide layer on the ESD protective circuits, non-silicided ESD protective circuits are formed on the substrate. Nevertheless, the method according to the patent is used with a complicated etching process and an extra lithography process, and it could length the processing time of integrated circuits.

As stated above, a salicide process for MOS devices without complicated etching process is needed and the ESD performance of the circuits of the MOS devices is not affected by the salicide process.

SUMMARY OF THE INVENTION

A method to manufacture a non-silicided region for electrostatic discharge (ESD) protection devices on a substrate is disclosed in the present invention. The method comprises following steps. A substrate is provided and field oxide regions are formed to define an ESD protective region, an NMOS region and a PMOS region on the substrate. A silicon oxide layer and a polysilicon layer are formed on the substrate. The silicon oxide layer and the polysilicon layer are etched back to define a gate and a gate oxide for the NMOS region and the PMOS region and to form a protective layer for the ESD protective region. A first ion implantation containing N-type conducting dopants is performed on the NMOS region and the PMOS region to form a lightly doped drain (LDD) for the NMOS region. A second ion implantation containing P-type conducting dopants is implemented to form a LDD region. A silicon oxide layer is defined to form spacers for the polysilicon layer of the ESD protective region and the gates for the NMOS region and the PMOS region. A third ion implantation containing N-type conducting dopants is performed on the ESD protective region and the NMOS region to form source/drain regions for the NMOS region. A fourth ion implantation containing P-type conducting dopants is performed on the PMOS region to form source/drain regions. A metal layer is sputtered on all the regions. A first rapid thermal annealing (RTA) process is used to form a silicide layer on the gate and the source/drain regions for the NMOS region and the PMOS region, and on the polysilicon of the ESD protective region. The unreacted metal during said first RTA process is removed by using a wet etching. A second RTA process is performed to stablize the silicides layer phase. The polysilicon layer is etched back to form a gate for a ESD protective device. Finally, a fifth ion implantation containing N-type conducting dopants is performed on the ESD protective region to form source/drain regions of the ESD protective device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 shows a cross sectional view of a substrate having a PMOS, NMOS region and a ESD protective region in accordance with the present invention;

FIG. 2 shows the formation of lightly doped drain (LDD) regions in the NMOS device in accordance with the present invention;

FIG. 5 shows that dopants are implanted into the PMOS device to form source/drain regions in accordance with the present invention;

FIG. 6 shows the formation of a silicide layer on the gate, drain/source regions and the ESD region in accordance with the present invention;

DETAILED DESCRIPTION OF THE PREFERRED EMBODIMENT

Figure 3:
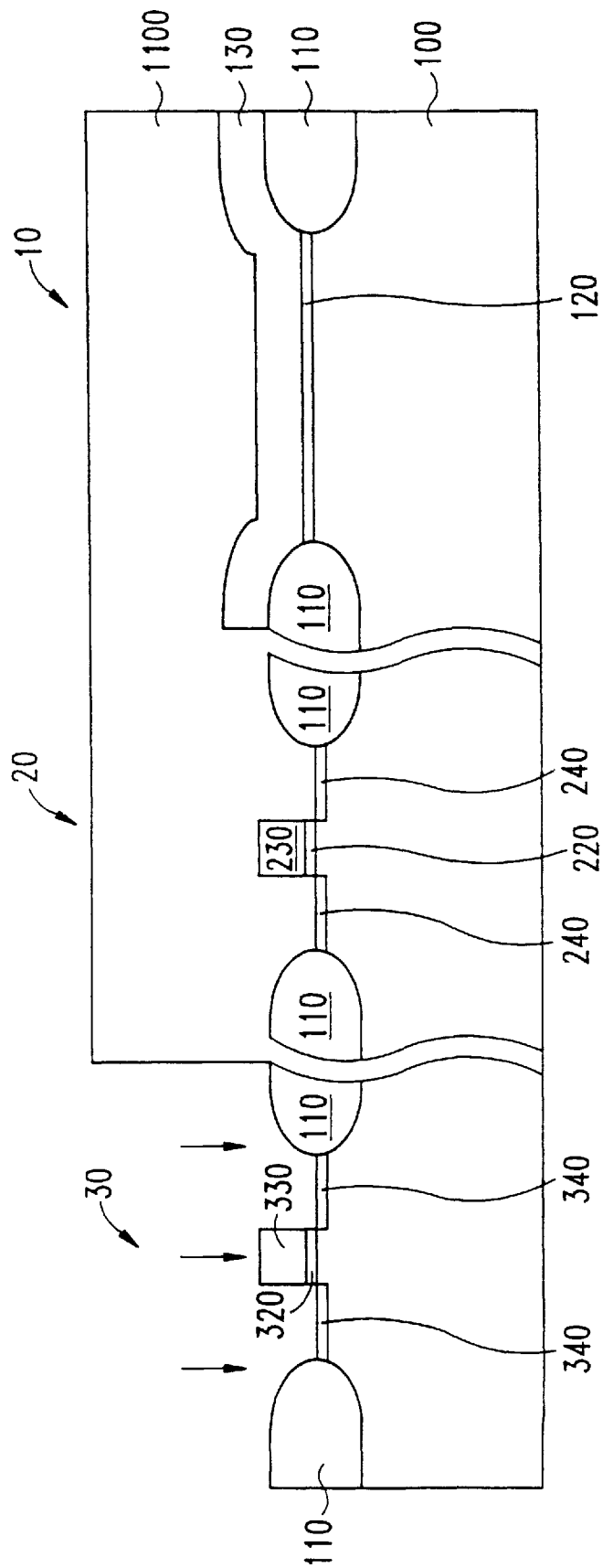
FIG. 3 shows the formation of LDD regions in the PMOS device in accordance with the present invention.

The present invention proposes a simple method to fabricate the non-silicided region for ESD protection circuits with no additional mask. The ESD protection device is protected by a polysilicon layer, which is formed during the definition of the gate of the peripheral circuits. Besides, the polysilicon layer is used to be a hard mask for the ESD protective device during a salicide process for peripheral circuit. Thus, the salicide layer is formed on the active region of the peripheral circuits but not on the source/drain regions of the ESD protective device.

Referring to FIG. 1, a single crystal P-type substrate 100 with a <100> crystallographic orientation is used for the preferred embodiment. A thick field oxide region (FOX) 102 is created using conventional methods for the purposes of isolation. Generally speaking, the FOX 110 region is created via photolithography and dry etching steps to etch a silicon nitride/silicon dioxide composite layer. After the photoresist is removed and wet cleaned, a thermal oxidation in an oxygen-steam ambient is used to form the FOX 110 region, to a thickness of about 3000 to 8000 angstroms. Between the field oxide regions 110, an ESD protective region 10, NMOS region 20 and PMOS region 30 are defined on the substrate 100.

Initially, a gate oxide 220 and 230 are defined atop NMOS region 20 and PMOS region 30, respectively. Besides, a gate 130, 230 and 330 are defined on the gate oxide of the NMOS region 20 and PMOS region 30. In the preferred embodiment, the gate oxide is formed by using an oxygen-steam ambient. Alternatively, the gate oxide may be formed using other known oxide chemical composition and procedures. In the preferred embodiment, the thickness of the gate oxide layer is approximately 30 to 200 angstroms. The gate electrode is consequently formed from polysilicon material. As is known in the art, the polysilicon can be formed by using low pressure chemical vapor deposition (LPCVD) process, using silane as a source. The thickness of the polysilicon layer is approximately 1000 to 5000 angstroms. Thus, only cursory description of the formation of gate structure is given here. During the definition of the gates and the gate oxide layers, a silicon oxide layer 120 and a polysilicon layer 130 are formed on the ESD protective region 10. The polysilicon layer 130 is used to be a protective layer of the ESD protective region 10.

Turning to FIG. 2, a photoresist layer 1000 is formed on the PMOS regions 30 and an ion implantation is applied to form N-LDD regions 240 in the NMOS region 20. N-type dopants are implanted using the polysilicon layer 130 and photoresist layer 1000 as masks into the ESD protective region 10 and the NMOS region 20, simultaneously. As the polysilicon layer 130 is covered on the ESD protective region 10, the substrate 100 below the polysilicon layer 130 is not doped. By using the polysilicon layer 130 as a mask, a lithography process for protecting the ESD protective region 10 is omitted. In a preferred embodiment, the ion implantation containing N-type dopants is performed with a dosage between about $5 \times 10^{12}$ to $5 \times 10^{14}$ ions/cm$^2$, at an energy between about 10 to 80 KeV. After the formation of the N-LDD regions, the photoresist layer 1000 is removed by using a conventional technology.

Turning to FIG. 3, a photoresist layer 1100 is defined on the ESD protective region 10 and the NMOS region 20 to expose the PMOS region 30 exposed. A P-LDD implantation is then performed to form P-LDD region 340 in the PMOS region 30. As is skilled in the art, the P-type dopant is typically boron ion and the implantation is performed with a dose between about $5 \times 10^{12}$ to $5 \times 10^{14}$ ions/cm$^2$, at an energy between about 5 to 60 KeV. Following the formation of the P-LDD regions 340, the photoresist layer 1100 is stripped.

Figure 4:
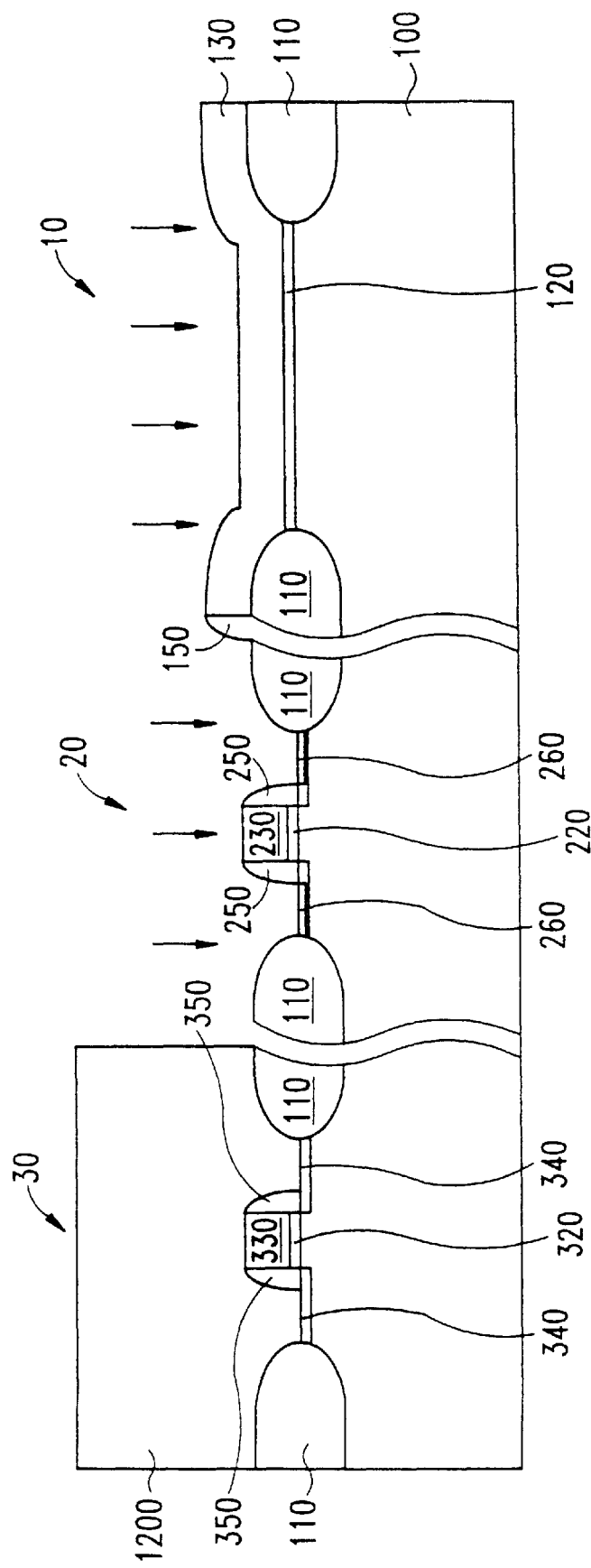
FIG. 4 shows that dopants are implanted into the NMOS device to form source/drain regions in accordance with the present invention.

Afterwards, spacers 150 of the polysilicon layer 130, spacers 250 of the gate 230, spacers 350 of the gate 330 are formed by using the definition of a silicon oxide layer. A photoresist layer 1200 is defined to protect the PMOS region 30. Besides, an ion implantation containing N-type dopants is used to form source/drain regions 260 in the NMOS region 20, as shown in FIG. 4, by using the photoresist layer 1200 as the hard mask of the PMOS region 30. The polysilicon layer 130 acts as a mask to prevent the ESD region 130 from doping. In a case, the ion implantation for forming the source/drain regions 260 is applied with a dose between about $5 \times 10^{14}$ to $5 \times 10^{16}$ ions/cm$^2$, at an energy between about 0.1 to 60 KeV. The photoresist layer 1200 is stripped after that the implantation process is done.

As shown in FIG. 5, a photoresist layer 1300 is created by lithography process on the ESD protective region 10 and the NMOS region 20. The PMOS region 30 is doped to form source/drain regions 360 by doped the substrate 100 behind the spacers 350. As be known in the art, a dose of dopants between about $5 \times 10^{14}$ to $5 \times 10^{16}$ ions/cm$^2$, at an energy between about 0.1 to 60 KeV, is used to form the source/drain region 360.

Turning to FIG. 6, a self-aligned silicided process is done to form salicide layers. Firstly, a refractory or noble metal is deposited on the entire region by using physical vapor deposition (PVD) process or chemical vapor deposition (CVD) process and it is typically formed of Ti, W, Co, Ni, Cr, Pd and Pt, etc. Following the deposition of the metal layer, a two-step rapid thermal annealing (RTA) process is performed to form salicide layers 170, 270 and 370 on the source/drain regions and the gate of the all regions, and on the polysilicon layer 130, as illustrated in FIG. 6. In a preferred embodiment, the first RTA process is done at a temperature between about 300 to 700 degrees centigrade and the second RTA process has an annealing temperature between about 750 to 1050 degrees centigrade. After the first-step RTA process, the unreacted metal layer during the first RTA process is removed in a room temperature mixture of DI $H_2O$, $H_2O_2$ and $NH_4OH$ at a ratio 5:1:1, a second RTA process is used to lower the sheet resistance of the silicide layer, and to stabilize the phase of silicide layers.

Figure 7:
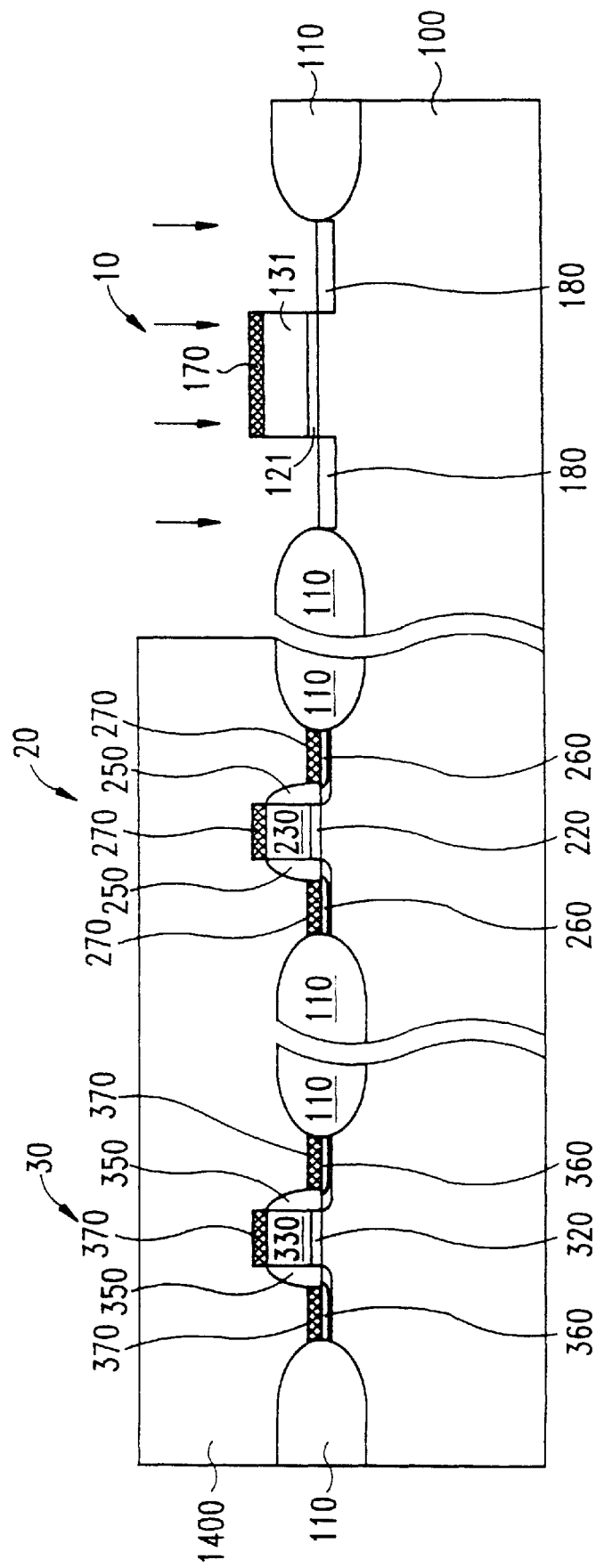
FIG. 7 shows the definition of the gate structure and the source/drain regions in the ESD protective region in accordance with the present invention.

Turning to FIG. 7, the polysilicon layer 130 and the silicon oxide layer 120 are anisotropically etched back to define a gate oxide 121 and a gate 131 of the ESD protective device 10, and the substrate 100 behind the gate 131 exposes. High dose arsenic and/or phosphorus ions are implanted into the ESD protective region 10 to form the source/drain region 180. In a preferred embodiment, the implantation process is done with a dose between about $5\times10^{14}$ to $5\times10^{16}$ ions/cm$^2$, at an energy between about 0.5 to 120 KeV. A photoresist layer 1400 is used to prevent the NMOS region 20 and the PMOS region 30 from be doped. Afterwards, the photoresist layer 1400 is stripped by using conventional lithography technique.

Figure 8:
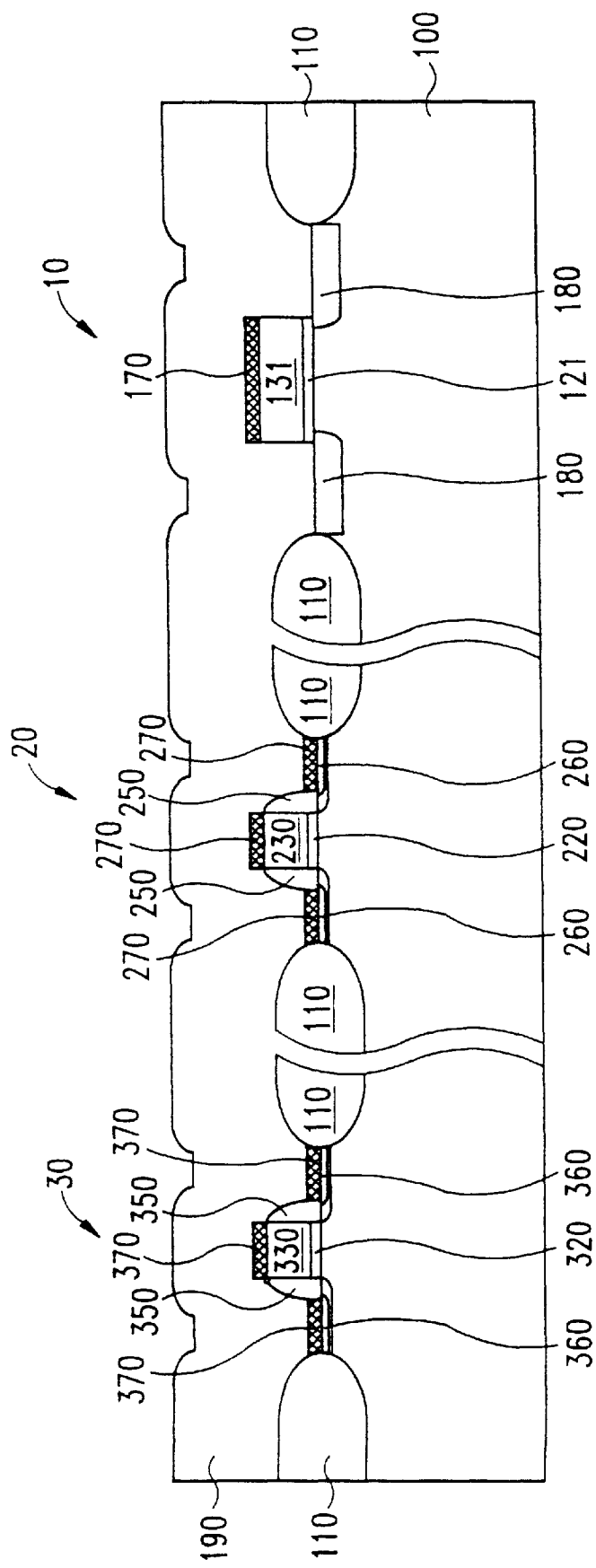
FIG. 8 shows a schematic cross-sectional view of a substrate, which is covered by a thick oxide layer, and then a high temperature $O_2$ anneal process is performed.

As illustrated in FIG. 8, a thick CVD oxide layer 190, like TESO-oxide or BPSG, is deposited on all region. The CVD oxide layer 190 has a thickness between about 3000 to 8000 angstroms. Finally, a high temperature $O_2$ annealing process is used to densify the CVD oxide layer 190.

There are several benefits in the present invention. The circuit operation speed could be significantly improved due to the NMOS and PMOS device having source/drain and gate regions with silicide layers. According to the prior art, the device with a silicided contact has a faster operation speed than that of a conventional device. Besides, a higher ESD protective voltage could be obtained as the ESD device has non-silicided source/drain regions. In addition, the proposed recipe of the present invention do not need a mask to block the ESD protective device during the salicidation process of the peripheral circuits.

While the preferred embodiment of the invention has been illustrated and described, it will be appreciated that various changes can be made therein without departing from the spirit and scope of the invention.

What is claimed is:

1. A method to fabricate a non-silicided region for electrostatic discharge (ESD) protection circuit, said method comprising steps of:

providing a substrate having field oxide regions to define a first region, a second region and a third region;

forming a silicon oxide layer on said substrate;

forming a polysilicon layer on said silicon oxide layer;

etching back said silicon oxide layer and said polysilicon layer to define a gate and a gate oxide on said second region and said third region, a protective layer composing said silicon oxide and said polysilicon layer on said first region;

performing a first ion implantation containing N-type conducting dopants on said first region and said second region to form a lightly doped drain (LDD) regions in said second region;

performing a second ion implantation containing P-type conducting dopants on said third region to form LDD regions;

defining a silicon oxide layer to form spacers for said polysilicon layer of said first region and said gates for said second region and said third region;

performing a third ion implantation containing N-type conducting dopants on said first region and said second region to form source/drain regions for said second region;

performing a fourth ion implantation containing P-type conducting dopants on said third region to form source/drain regions;

performing a self-aligned silicided process to form a silicide layer on said gate and said source/drain regions for said second region and said third region, and on said polysilicon of said first region;

etching back said protective layer to form a gate for an ESD protective device; and performing a fifth ion implantation containing N-type conducting dopants on said first region to form source/drain regions of said ESD protective device.

2. the method of claim 1, wherein said self-aligned silicided process comprising steps of:

forming a metal layer on all said regions;

performing a first rapid thermal annealing (RTA) process to form said silicide layer;

removing said unreacted metal during said first RTA process by a wet etching process; and performing a second RTA process.

3. The method of claim 2, wherein said metal layer is selected from a group consisting of Ti, W, Co, Ni, Cr, Pd and Pt.

4. The method of claim 2, wherein said first RTA process has an annealing temperature between about 300 to 700° C..

5. The method of claim 2, wherein said second RTA process has an annealing temperature between about 750 to 1050° C..

6. The method of claim 1, wherein said first ion implantation is performed with a dose between about $5\times10^{12}$ to $5\times10^{14}$ ions/cm$^2$, at an energy between about 10 to 80 KeV.

7. The method of claim 1, wherein said second ion implantation is performed with a dose between about $5\times10^{12}$ to $5\times10^{14}$ ions/cm$^2$, at an energy between about 5 to 60 KeV.

8. The method of claim 1, wherein said third ion implantation is performed with a dose between about $5\times10^{14}$ to $5\times10^{16}$ ions/cm$^2$, at an energy between about 0.1 to 60 KeV.

9. The method of claim 1, wherein said fourth ion implantation is performed with a dose between about $5\times10^{14}$ to $5\times10^{16}$ ions/cm$^2$, at an energy between about 0.1 to 60 KeV.

10. The method of claim 1, wherein said fifth ion implantation is performed with a dose between about $5\times10^{14}$ to $5\times10^{16}$ ions/cm$^2$, at an energy between about 0.5 to 120 KeV.

11. The method of claim 1, wherein said polysilicon layer has a thickness between about 1000 to 5000 angstroms.

12. The method of claim 1, further comprising a silicon oxide layer is deposited on all said region after that said source/drain regions of said first region are defined.

13. A method to fabricate a non-silicided region for electrostatic discharge (ESD) protection circuit, said method comprising steps of:

providing a substrate having field oxide regions to define a first region, a second region and a third region;

forming a silicon oxide layer on said substrate;

forming a polysilicon layer on said silicon oxide layer;

etching back said silicon oxide layer and said polysilicon layer to define a gate and a gate oxide on said second region and said third region, and a protective layer composing said silicon oxide and said polysilicon layer on said first region;

performing a first ion implantation containing N-type conducting dopants on said first region and said second region to form a lightly doped drain (LDD) region in said second region;

performing a second ion implantation containing P-type conducting dopants on said third region to form a LDD region;

defining a silicon oxide layer to form spacers for said polysilicon layer of said first region and said gates for said second region and said third region;

performing a third ion implantation containing N-type conducting dopants on said first region and said second region to form source/drain regions for said second region;

performing a fourth ion implantation containing P-type conducting dopants on said third region to form source/drain regions;

forming a metal layer on all said regions;

performing a first rapid thermal annealing (RTA) process to form a silicide layer on said gate and said source/drain regions for said second region and said third region, and on said protective layer of said first region;

removing said unreacted metal during said first RTA process by using a wet etching;

performing a second RTA process;

etching back said protective layer to form a gate for an ESD protective device; and performing a fifth ion implantation containing N-type conducting dopants on said first region to form source/drain regions of said ESD protective device.

14. The method of claim 13, wherein said first ion implantation is performed with a dose between about $5\times10^{12}$ to $5\times10^{14}$ ions/cm$^2$, at an energy between about 10 to 80 KeV.

15. The method of claim 13, wherein said second ion implantation is performed with a dose between about $5\times10^{12}$ to $5\times10^{14}$ ions/cm$^2$, at an energy between about 5 to 60 KeV.

16. The method of claim 13, wherein said third ion implantation is performed with a dose between about $5\times10^{14}$ to $5\times10^{16}$ ions/cm$^2$, at an energy between about 0.1 to 60 KeV.

17. The method of claim 13, wherein said fourth ion implantation is performed with a dose between about $5\times10^{14}$ to $5\times10^{16}$ ions/cm$^2$, at an energy between about 0.1 to 60 KeV.

18. The method of claim 13, wherein said fifth ion implantation is performed with a dose between about $5\times10^{14}$ to $5\times10^{16}$ ions/cm$^2$, at an energy between about 0.5 to 120 KeV.

19. The method of claim 13, wherein said polysilicon layer has a thickness between about 1000 to 5000 angstroms.

20. The method of claim 13, wherein said metal layer is selected from a group consisting of Ti, W, Co, Ni, Cr, Pd and Pt.

* * * * *